United States Patent
Maekawa

(10) Patent No.: US 6,991,330 B2
(45) Date of Patent: Jan. 31, 2006

(54) INK-JET RECORDING MATERIAL FOR PROOF

(75) Inventor: Iwao Maekawa, Tokyo (JP)

(73) Assignee: Mitsubishi Paper Mills Limited, Tokyo (JP)

( * ) Notice: Subject to any disclaimer, the term of this patent is extended or adjusted under 35 U.S.C. 154(b) by 109 days.

(21) Appl. No.: 10/421,860

(22) Filed: Apr. 24, 2003

(65) Prior Publication Data

US 2003/0203133 A1 Oct. 30, 2003

(30) Foreign Application Priority Data

Apr. 26, 2002 (JP) ............................. 2002-126755

(51) Int. Cl.
*B41J 2/01* (2006.01)

(52) U.S. Cl. ...................... 347/105; 347/101; 428/32.1

(58) Field of Classification Search ................ 347/105, 347/101; 428/195, 32.1
See application file for complete search history.

(56) References Cited

U.S. PATENT DOCUMENTS

| | | | |
|---|---|---|---|
| 5,122,413 A * | 6/1992 | Ohno et al. | 428/319.9 |
| 6,013,354 A * | 1/2000 | Tomizawa et al. | 428/206 |
| 6,579,598 B2 * | 6/2003 | Tokunaga et al. | 428/32.22 |
| 6,780,479 B2 * | 8/2004 | Katsuoka et al. | 428/32.39 |
| 6,783,817 B2 * | 8/2004 | Nemoto et al. | 428/32.24 |
| 2003/0081103 A1 * | 5/2003 | Ishimaru et al. | 347/105 |
| 2003/0134093 A1 * | 7/2003 | Kitamura et al. | 428/195 |

* cited by examiner

*Primary Examiner*—Manish S. Shah
(74) *Attorney, Agent, or Firm*—Paul E. White, Jr.; Manelli Denison & Selter PLLC

(57) ABSTRACT

Disclosed are an ink-jet recording material for proof including a water-resistant support and at least one ink-receptive layer containing inorganic fine particles and a hydrophilic binder provided on the support, wherein the water-resistant support has a center line average roughness Ra75 with a cut off value of 0.8 mm according to JIS-B0601 of 1.0 μm or less, and an uppermost ink-receptive layer farthest from the water-resistant support contains a colorless or white matting agent having an average particle size of 1 to 10 μm and a colored pigment having an average particle size of 1 μm or less, and use of the same for proof.

14 Claims, No Drawings

INK-JET RECORDING MATERIAL FOR PROOF

BACKGROUND OF THE INVENTION

1. Field of the Invention

This invention relates to an ink-jet recording material which utilizes an ink-jet recording system, has no cockling and good ink-absorption property, and to be used for printing proof. More specifically, it relates to an ink-jet recording material for proof having similar surface feeling to that of a printing paper which is an object of proof, providing an image printed by an ink-jet which is similar looks to an image printed on a printing paper, and is suitable for printing proof.

2. Prior Art

In recent years, according to remarkable progress in an ink-jet printer or a plotter, a full-color and finer image can be obtained easily.

An ink-jet recording system is to carry out recording of image, letters, etc., by adhering a fine liquid drop of ink to a recording sheet such as paper by spouting ink due to various kinds of principles. An ink-jet printer or a plotter has been rapidly spread in recent years in various kinds of uses as a hard copy preparing device of an image information such as letters, various kinds of graphics prepared by a computer. In particular, a color image formed by a multi-color ink-jet recording system can give a recorded image similar to or the same as a multi-colored printed material by a plate-making system or a color photographic system. Moreover, for the use of preparing a small number of printed materials, it is now widely applying since the cost is cheaper than that prepared by the printing technique or photographic technique.

In recent years, a recording material utilizing an ink-jet recording system has now been frequently utilized as a printing proof for checking a finishing printed material before carrying out actual printing. Among the printers commercially sold recently, there is a printer to be used only for printing proof, and thus, it has been desired to develop a recording material suitable for such a use. Here, as an ink-jet recording material to be used for printing proof, it is most important to faithfully reproduce colors or surface feeling of a printing paper.

Also, color shade of a printing paper to be generally used for printing is not pure white and a certain color shade is generally provided to the printing paper depending on the purposes. On the other hand, to an ink-jet recording material, an ink-absorption property, color reproducibility, etc. are required, so that a pigment, adhesive and various kinds of additives to be used have been devised. As a pigment to be used, a porous synthetic pigment is frequently used to obtain good absorption property, and to obtain clear color of a resulting ink-jet image, its color shade becomes a specific white image derived from the pigment used.

An ink-jet recording material presently sold has quite different lightness, color degree or surface feeling from those of a printing paper which is an object to proof. Also, there are problems that fluctuation in color hue due to difference in light source or color fading by light with a lapse of time is remarkable, so that it is difficult to obtain satisfied quality, and thus, it is difficult to use the same as a material for printing proof.

A method of matching a color hue to a printing paper by adding a coloring agent has been known and disclosed in Japanese Provisional Patent Publication No. 2001-277702. However, there is no description therein to use a water-resistant support, to use a colored pigment as a coloring agent and effects thereof on cockling, improvement in fading with a lapse of time and surface feeling.

Also, a method of adjusting surface feeling by specifying average surface roughness of an ink-absorption layer has been disclosed in Japanese Provisional Patent Publication No. 2000-52649. However, there is no description about a surface roughness of a water-resistant support and it is difficult to match the surface feeling to a printing paper which is an object of proof only by the ink-absorption layer.

Also, a method of improving difference in glossiness or obtaining high glossiness and smoothness by specifying a center-line average roughness (Ra) of a water-resistant support has been disclosed in Japanese Provisional Patent Publications No. 7-25133 and 2001-341409. However, there is no description to adjust surface feeling by specifying particle size of a colored pigment or matting agent or to use the same for proof.

SUMMARY OF THE INVENTION

An object of the present invention is to provide an ink-jet recording material for proof which is suitable for printing proof, causing no cockling, having excellent ink-absorption property and less fading by light with a lapse of time, having similar surface feeling as that of a printing paper which is an object of proof and having similar looks of an ink-jet printed image to an image printed on the printing paper which is an object of proof.

The above objects of the present invention have been achieved by an ink-jet recording material for proof which comprises a water-resistant support and at least one ink-receptive layer containing inorganic fine particles and a hydrophilic binder provided on the support, wherein the water-resistant support has a center line average roughness (Ra75) with a cut off value of 0.8 mm according to JIS-B0601 of 1.0 $\mu$m or less, and an uppermost ink-receptive layer farthest from the water-resistant support (herein-after referred to as "the uppermost ink-receptive layer") contains a colorless or white matting agent having an average particle size of 1 to 10 $\mu$m and a colored pigment having an average particle size of 1 $\mu$m or less.

DESCRIPTION OF THE PREFERRED EMBODIMENTS

In the following, the ink-jet recording material for proof of the present invention will be explained in detail.

As the water-resistant support to be used in the present invention, there may be mentioned synthetic paper, a plastic resin film such as a polyester resin including polyethylene terephthalate, a diacetate resin, a triacetate resin, an acrylic resin, a polycarbonate resin, a polyvinyl chloride resin, a polyimide resin, cellophane, celluloid, etc., and a resin coated paper in which a polyolefin resin is laminated on the both surfaces of paper, and the like. In the present invention, these water-resistant supports are required to have a center line average roughness (Ra75) with a cut off value of 0.8 mm according to JIS-B0601 of 1.0 $\mu$m or less to make a surface feeling similar to that of a printing paper which is an object of proof. For example, a support prepared by making a surface smooth using cooling rollers subjected to mirror surface treatment or fine rough-surface treatment in a heat fusion extrusion laminating method of a thermoplastic resin, or a heat calender treatment may be used. Even when a support having Ra75 of exceeding 1.0 $\mu$m is used, surface feeling of the resulting paper cannot be made similar to a printing paper which is an object of proof by an ink-receptive layer, so that it cannot be used in the present invention. In the present invention, a resin-coated paper is particularly preferably used since it can be easily made similar in surface feeling to a printing paper which is an object of proof.

A base paper constituting the polyolefin resin-coated paper is not particularly limited, and any paper generally used may be employed. More preferably, a smooth base paper such as those used as paper for a photographic support may be used. As pulp constituting the base paper, natural pulp, regenerated pulp, synthetic pulp, etc. may be used singly or in combination of two or more. In the base paper, various additives conventionally used in the papermaking industry such as a sizing agent, a strengthening additive of paper, a loading material, an antistatic agent, a fluorescent brightener, a dye, etc. may be formulated.

Moreover, a surface sizing agent, a surface strengthening additive of paper, a fluorescent brightener, an antistatic agent, a dye, an anchoring agent, etc. may be coated on the surface of the base paper.

A thickness of the base paper is not particularly limited, and preferably that having a good surface smoothness prepared by compressing paper during paper-making or after paper-making by applying pressure using a calender, etc. A basis weight thereof is preferably 30 to 250 g/m$^2$.

As a resin for the resin-coated paper, a polyolefin resin or a resin which cures by irradiation of electron rays may be used. As the polyolefin resin, there may be mentioned, for example, a homopolymer of an olefin such as a low density polyethylene, a high density polyethylene, polypropylene, polybutene, polypentene, etc.; a copolymer comprising two or more olefins such as an ethylenepropylene copolymer, etc.; or a mixture thereof. These polymers having various densities and melt viscosity indexes (Melt Indexes) may be used singly or in combination of two or more.

Also, to the resin of the polyolefin resin layer, various kinds of additives including a white pigment such as titanium oxide, zinc oxide, talc, calcium carbonate, etc.; an aliphatic amide such as stearic amide, arachidamide, etc.; an aliphatic metal salt such as zinc stearate, calcium stearate, aluminum stearate, magnesium stearate, etc.; an antioxidant such as Irganox 1010, Irganox 1076 (both trade names, available from Ciba Geigy AG), etc.; a blue-color pigment or dye such as cobalt blue, ultramarine blue, cecilian blue, phthalocyanine blue, etc,; a magenta-color pigment or dye such as cobalt violet, fast violet, manganese violet, etc.; a fluorescent brightener, an UV absorber, etc. may be preferably added alone or optionally combining two or more.

The resin-coated paper which is a support to be preferably used in the present invention can be prepared by casting a melted resin under heating on a running base paper by an extruder which is so-called an extrusion coating method in the case of a polyolefin resin, whereby both surfaces are coated by the resin. Also, in the case of a resin cured by electron rays, a resin is coated by a generally employed coater such as a gravure coater, a blade coater, etc., and electron rays are irradiated to cure the resin, whereby coating is carried out. Also, before coating the resin on the base paper, it is preferred to carry out an activation treatment such as a corona discharge treatment, a flame treatment, etc., of the base paper. A surface (a front surface) to which an ink-receptive layer is provided of a support is a gloss surface. It is not necessarily subjected to resin coating at the back surface of the base paper, but in view of preventing curl, it is preferred to provide a resin layer at the back surface of the base paper. The back surface is generally a non-gloss surface, and an activation treatment such as a corona discharge treatment, a flame treatment, etc., may be applied to the front surface and, if necessary to the both surfaces of the front and back surfaces.

In the resin-coated paper to be used in the present invention, a subbing layer can be provided at the surface of the support on which the ink-receptive layer is provided for the purposes of strengthen an adhesive strength between the ink-receptive layer and the support, and the like. This subbing layer is previously provided by coating on the surface of the polyolefin resin layer and dried before providing the ink-receptive layer by coating. This subbing layer mainly contains a water-soluble polymer or a polymer latex which is capable of forming a film. It is preferably a water-soluble polymer such as gelatin, polyvinyl alcohol, polyvinyl pyrrolidone, a water-soluble cellulose and the like, particularly preferably gelatin. An amount of the subbing layer is preferably 10 to 500 mg/m$^2$ in a solid content, more preferably in the range of 20 to 300 mg/m$^2$. Moreover, a surfactant or a hardener is preferably further added to the subbing layer. Before coating the subbing layer on the resin-coated paper, it is preferred to treat the paper with a corona discharge treatment.

To the support of the present invention, various kinds of back coating layers may be provided by coating for the purpose of providing antistatic property, feeding and conveying property, curl preventive property and the like. To the back coating layer, an inorganic antistatic agent, an organic antistatic agent, a water-soluble polymer, a polymer latex, a curing agent, a pigment such as colloidal silica, a surfactant and the like may be added in optional combination.

Also, the inorganic fine particles to be used in the ink-receptive layer of the present invention are particles having an average particle size of 1 $\mu$m or less, and conventionally known materials such as synthesized silica, alumina, alumina hydrate, calcium carbonate, magnesium carbonate, titanium dioxide, etc. have been used. Of these, synthesized silica, alumina and alumina hydrate are preferably used, and synthesized silica is most preferably used since it can easily be made similar in surface feeling to a printing paper which is an object of proof.

In synthesized silica, they can be roughly classified into fumed silica, wet method silica, and others according to the preparation process. The wet method silica can be further classified into a precipitated method silica, a gel method silica and a sol method silica according to the preparation process. The precipitated silica can be prepared by reacting sodium silicate and sulfuric acid under alkali conditions, silica particles grown in particle size aggregated and precipitated, and then, they are processed through filtration, washing, drying, pulverization and classification to obtain a product. The silica secondary particles prepared by this method become gently aggregated particles, and relatively easily pulverizing particles can be obtained. As the precipitated silica, it is commercially available from Nippon Silica Industrial Co., Ltd. under tradename of Nipsil, K.K. Tokuyama under tradenames of Tokusil, Finesil and the like. The gel method silica can be produced by reacting sodium silicate and sulfuric acid under acidic conditions. In this method, small silica particles are dissolved during ripening and so reprecipitated between primary particles which are large sized particles that primary particles are combined to each other. Thus, clear primary particles disappear and form relatively hard agglomerated particles having inner void structure. For example, it is commercially available from Mizusawa Industrial Chemicals, Ltd. under tradename of Mizukasil, Grace Japan Co., Ltd. under tradename of Cyrojet, and the like. The sol method silica is also called to as colloidal silica and can be obtained by heating and ripening silica sol obtained by methathesis of sodium silicate by an acid or passing through an ion-exchange resin layer, and is commercially available from Nissan Chemical Industries, Ltd. under tradename of SNOWTEX.

In the present invention, the wet method silica preferably used is a precipitated method silica or a gel method silica, more preferably a precipitated method silica. These wet method silica generally has a secondary average particle size of 1 µm or more, so that they are used after finely pulverizing. As a pulverization method, a wet type dispersing method can be preferably used, which pulverizes silica dispersed in an aqueous medium mechanically. As a wet type dispersing machine, there may be preferably used a media mill such as ball mill, beads mill, sand grinder, etc., a pressure type dispersing machine such as a high pressure homogenizer, a ultra-high pressure homogenizer, etc., an ultrasonic wave dispersing machine, and a thin film revolution (or pivoted) type dispersing machine, etc. In the present invention, a media mill such as beads mill is particularly preferably used.

Pulverization of a wet method silica according to the present invention is preferably carried out in the presence of a cationic compound. When a cationic compound is added to silica dispersed in water, agglomerated materials tend to be caused. However, when the materials are subjected to pulverization treatment, it is possible to disperse the material therein with a higher concentration than the case where they are dispersed in water alone. As a result, dispersion efficiency is increased and the particles can be pulverized with finer particle size. Moreover, by using a dispersion with a high concentration, a concentration of a coating solution can be heightened at the time of preparing the coating solution whereby there is a merit of improving production efficiency and the like. Particularly when wet method silica having a secondary average particle size of 5 µm or more is used, increase in viscosity due to occurrence of agglomerate at an initial stage can be inhibited, and dispersion with a higher concentration can be realized so that it is more advantageous. An upper limit of the secondary average particle size is not specifically limited, and a secondary average particle size of the wet method silica is usually 200 µm or less.

As the cationic compounds, there may be mentioned a cationic polymer and a water-soluble metallic compounds. As the cationic polymer, there may be preferably mentioned polyethyleneimine, polydiallylamine, polyallylamine, polyalkylamine, as well as polymers having a primary to tertiary amino group or a quaternary ammonium salt group as disclosed in Japanese Provisional Patent Publications No. 20696/1984, No. 33176/1984, No. 33177/1984, No. 155088/1984, No. 11389/1985, No. 49990/1985, No. 83882/1985, No. 109894/1985, No. 198493/1987, No. 49478/1988, No. 115780/1988, No. 280681/1988, No. 40371/1989, No. 234268/1994, No. 125411/1995 and No. 193776/1998, etc. A molecular weight (a weight average molecular weight; Mw) of these cationic polymers is preferably about 2,000 to about 100,000, particularly preferably about 2,000 to 300,000. If the molecular weight exceeds 100,000, the dispersion becomes too viscous so that is not preferred.

The water-soluble metallic compound may include, for example, a water-soluble polyvalent metallic salt, and a water-soluble salt of a metal selected from the group consisting of calcium, barium, manganese, copper, cobalt, nickel, aluminum, iron, zinc, zirconium, titanium, chromium, magnesium, tungsten and molybdenum. More specifically, such a water-soluble metallic compound may include, for example, calcium acetate, calcium chloride, calcium formate, calcium sulfate, barium acetate, barium sulfate, barium phosphate, manganese chloride, manganese acetate, manganese formate dihydrate, ammonium manganese sulfate hexahydrate, cupric chloride, copper (II) ammonium chloride dihydrate, copper sulfate, cobalt chloride, cobalt thiocyanate, cobalt sulfate, nickel sulfate hexahydrate, nickel chloride hexahydrate, nickel acetate tetrahydrate, ammonium nickel sulfate hexahydrate, amide nickel sulfate tetrahydrate, aluminum sulfate, aluminum sulfite, aluminum thiosulfate, poly(aluminum chloride), aluminum nitrate nonahydrate, aluminum chloride hexahydrate, ferrous bromide, ferrous chloride, ferric chloride, ferrous sulfate, ferric sulfate, zinc bromide, zinc chloride, zinc nitrate hexahydrate, zinc sulfate, titanium chloride, titanium sulfate, zirconium acetate, zirconium chloride, zirconium oxychloride octahydrate, zirconium hydroxychloride, chromium acetate, chromium sulfate, magnesium sulfate, magnesium chloride hexahydrate, magnesium citrate nonahydrate, sodium phosphorus wolframate, tungsten sodium citrate, dodecawolframatophosphate n hydrate, dodecawolframatosilicate 26 hydrate, molybdenum chloride, dodecamolybdatephosphate n hydrate, etc.

Of the above-mentioned water-soluble polyvalent metallic compounds, a compound comprising aluminum or a metal of Group 4A (Group 4) of the periodic table (for example, zirconium, titanium) is preferably used. Particularly preferred is a water-soluble aluminum compound. As the water-soluble aluminum compound, there is known, for example, as an inorganic salt, aluminum chloride or its hydrate, aluminum sulfate or its hydrate, aluminum alum, etc. Moreover, basic polyaluminum which is an inorganic aluminum-containing cationic polymer has been known and preferably used.

As the water-soluble compound containing an element of Group 4A (Group 4) of the periodic table to be used in the present invention, a water-soluble compound containing titanium or zirconium is more preferably used. As the water-soluble compound containing titanium, there may be mentioned titanium chloride and titanium sulfate. As the water-soluble compound containing zirconium, there may be mentioned zirconium acetate, zirconium chloride, zirconium oxychloride, zirconium hydroxychloride, zirconium nitrate, basic zirconium carbonate, zirconium hydroxide, zirconium lactate, ammonium zirconium carbonate, potassium zirconium carbonate, zirconium sulfate, zirconium fluoride compound, and the like. In the present invention, the term "water-soluble" means that a compound which dissolves in water in an amount of 1% by weight or more at normal temperature and normal pressure is defined to be water-soluble.

As a specific method to obtain the wet method silica fine particles having an average secondary particle size of 500 nm or less of the present invention, there may be mentioned, for example, a method in which silica and at least one of a cationic polymer and a cationic metallic compound are added into water, and the mixture is stirred by using at least one dispersing machine such as a saw blade type dispersing machine, a propeller blade type dispersing machine and a rotor stator type dispersing machine to obtain a provisional dispersion. If necessary, a suitable low boiling point solvent or the like may be further added to the dispersion. An amount of the cationic polymer or the cationic metallic compound is preferably 0.5 to 20% by weight, more preferably 2 to 10% by weight based on the amount of the silica. By setting the amount within the above range, a viscosity of the silica provisional dispersion can be made not so high and a concentration of the solid content high. The concentration of the solid content of the silica provisional dispersion of the present invention is preferably as high as possible, but it is a higher concentration, dispersing silica becomes impossible so that a preferred range of the solid content is 20 to 60% by weight, more preferably 30 to 50% by weight.

The silica provisional dispersion obtained by the method as mentioned above is subjected to pulverization treatment by a beads mill. The beads mill means a device which is to treat a liquid material by filling beads in a container having a stirring device therein, charging the liquid material, driving the stirring device to collide beads to each other so that a shearing force is given to the liquid material. A grain size of the beads is generally 0.1 to 10 mm, preferably 0.2 to 1 mm, more preferably 0.3 to 0.6 mm. As the beads, there are glass beads, ceramics beads, metal beads, and the like, and in view of abrasion resistance and dispersion efficiency, zirconia beads are preferably used. Also, a filling ratio of the beads in the container is generally 40 to 80% by volume, preferably 55 to 80% by volume. According to the above-mentioned dispersing conditions, silica dispersion can be pulverized to an average secondary particle size of 500 nm or less with good efficiency without remaining coarse grains or occurrence of agglomerates. When the provisional dispersion is to be processed continuously, and when coarse grains likely remain with single pass (a number of passing the container is one), two or more times of treatments are preferably carried out. In the present invention, it is preferred to obtain a dispersion with a higher concentration within the range of causing no coarse grains since a solid concentration of a coating solution can be made high. A preferred range of the solid concentration of the silica dispersion according to the present invention is 20 to 60% by weight, more preferably 30 to 50% by weight. As a commercially available beads mill, there may be mentioned, for example, Nanomil (trade name) manufactured by Asada Tekkosha Co., Ultraviscomill (trade name) manufactured by IMEX Co., Ltd., Amullar type OB mill (trade name) manufactured by MATUBO Corporation and Dyno-mill (trade name) manufactured by Shinmaru Enterprises Corporation.

Gas phase method silica is also called to as the drying method silica, and can be generally prepared by a flame hydrolysis method. More specifically, it has been known a method in which silicon tetrachloride is burned with hydrogen and oxygen. In this method, silanes such as methyl trichlorosilane, trichlorosilane, etc., may be used alone in place of silicon tetrachloride or in combination with silicone tetrachloride. The fumed silica is commercially available from Nippon Aerosil K.K. (Japan) under the trade name of Aerosil, and K.K. Tokuyama (Japan) under the trade name of QS type, etc. The fumed silica to be used in the present invention preferably has an average primary particle size of 50 nm or less.

Alumina and alumina hydrate to be contained in the ink-receptive layer of the present invention are aluminum oxide or its hydrate, and may be crystalline or non-crystalline, and those having a shape of amorphous, spherical or platy one may be used. Either of alumina or alumina hydrate may be used or both may be used in combination.

As the alumina to be used in the present invention, γ-alumina which is a γ-type crystalline of aluminum oxide is preferably used, and δ-group crystalline is particularly preferred. It is possible to make a primary particle size of the γ-alumina as small as 10 nm or so, and generally and preferably used are those in which crystals having a secondary particle size of several thousands or several ten thousands nm are pulverized by an ultrasonic wave or a high pressure homogenizer, or a counter collision type jet pulverizer to a size of about 50 to 300 nm.

Alumina hydrate is shown by a structural formula of $Al_2O_3 \cdot nH_2O$ (where n is 1 to 3). When n is 1, it shows alumina hydrate having a boehmite structure alumina hydrate, and when n is larger than 1 and less than 3, it shows alumina hydrate having a pseudo boehmite structure alumina hydrate. It can be prepared by the conventionally known preparation methods such as hydrolysis of aluminum alkoxide such as aluminum isopropoxide, etc., neutralization of an aluminum salt by an alkali, hydrolysis of an aluminate, and the like.

An average primary particle size of the above-mentioned alumina hydrate is preferably 5 to 50 nm, particularly preferably platy particles having an average primary particle size of 5 to 30 nm and an average aspect ratio (a ratio of an average grain size to an average thickness) of 2 or more.

In the ink-jet recording material for proof of the present invention, an ink-receptive layer containing inorganic fine particles and a hydrophilic binder may comprise two or more layers. In the ink-receptive layer, the inorganic fine particles are preferably contained in an amount of 8 $g/m^2$ or more in total as a solid content, more preferably in the range of 10 to 35 $g/m^2$. By using the inorganic fine particles within the above range, good ink-absorption property and strength of coating layer(s) can be obtained.

In the present invention, the inorganic fine particles constitute a main component of the ink-receptive layer, that is, the inorganic fine particles are preferably contained in the ink-receptive layer in an amount of 50% by weight or more based on the total solid contents of the ink-receptive layer, more preferably 60% by weight or more, most preferably 65% by weight or more.

In the present invention, it is preferred to use inorganic fine particles having a specific surface area measured by the BET (Brunauer-Emmett-Teller) method of 10 $m^2/g$ or more, more preferably 20 $m^2/g$ or more. A specific surface area measured by the BET method of the fumed silica to be particularly preferably used in the present invention is 80 $m^2/g$ or more, and to obtain higher glossiness, a specific surface area thereof measured by the BET method is preferably 130 $m^2/g$ or more, more preferably 200 $m^2/g$ or more. The BET method mentioned in the present invention means one of a method for measuring surface area of powder material by a gas phase adsorption method and is a method of obtaining a total surface area possessed by 1 g of a sample, i.e., a specific surface area, from an adsorption isotherm. In general, as an adsorption gas, a nitrogen gas has frequently been used, and a method of measuring an adsorption amount obtained by the change in pressure or a volume of a gas to be adsorbed has most frequently been used. Most frequently used equation for representing isotherm of polymolecular adsorption is a Brunauer-Emmett-Teller equation which is also called to as a BET equation and has widely been used for determining a surface area of a substance to be examined. A specific surface area can be obtained by measuring an adsorption amount based on the BET equation and multiplying the amount with a surface area occupied by the surface of one adsorbed molecule.

Also, in the present invention, an absolute value of components of color differences between an ink-jet recording material for proof and a printing paper which is an object of proof is preferably 1.5 or less since color shade of the ink-jet recording material can be easily made similar to that of the printing paper which is an object of proof. For this purpose, it is necessary to adjust the color shade of the ink-jet recording material for proof of the present invention with a colored pigment having an average particle size of 1.0 μm or less. The absolute value of components of color differences between an ink-jet recording material for proof and a printing paper which is an object of proof is a value in which absolute values of components (ΔL*, Δa*, Δb*) of color differences regulated by JIS-Z8730 are calculated from values of lightness index (L*) and perception chromaticity indexes (a*, b*) regulated by JIS-Z8729 of an ink-jet recording material for proof and measured according to a measurement method of color and a light source for measurement regulated by JIS-Z8722 and JIS-Z8720, and values of lightness index (L*) and perception chromaticity indexes (a*, b*) regulated by JIS-Z8720 of a printing paper which is an object of proof. More specifically, the measurement is carried out under the conditions of D-n P (see Paragraph 6.3.2 in JIS-Z8722) with standard light of D65 as a light source.

Also, to at least uppermost ink-receptive layer containing inorganic particles and a hydrophilic binder of the ink-jet recording material for proof of the present invention, it is necessary to add a colorless or white matting agent having an average particle size of 1 to 10 μm for the purpose of making the surface feeling similar to a printing paper which is an object of proof, and a matting agent having an average particle size of 2 to 4 μm is particularly preferably used. If the matting agent having an average particle size of less than 1 μm or exceeding 10 μm is used, those having a surface feeling similar to that of a printing paper which is an object of proof cannot be obtained. Also, an amount of the matting agent may be determined by a printing paper which is an object of proof, and is generally 0.1 to 10% by weight based on the total solid weight of the ink-receptive layer to be added. Also, the matting agent may be a mono-dispersed or poly-dispersed, and those having degree of dispersion (standard deviation/average particle size) of 0.2 to 10 may be preferably used.

As the colorless or white matting agent having an average particle size of 1 to 10 μm to be used in the present invention, an inorganic or organic pigment having an average primary particle size or an average secondary primary particle size of 1 to 10 μm can be used. Such a matting agent may include those conventionally known in the art, for example, inorganic pigment such as diatomaceous earth, clay, calcined clay, talc, kaolin, calcined kaolin, calcium carbonate, magnesium carbonate, titanium dioxide, titanium dioxide-coated mica, barium sulfate, molybdenum white, zinc white, lithopone, zinc sulfate, gypsum, white lead, calcium sulfate, zinc oxide, zinc hydroxide, zinc carbonate, hydrotalcite, aluminum silicate, calcium silicate, magnesium silicate, aluminum hydroxide, zeolite, magnesium hydroxide, titanium oxide, silica, glass powder, barium sulfate, etc., and organic pigments such as a polystyrene resin, polymethyl methacrylate resin, polycarbonate resin, polyacrylate copolymer resin, etc. It is particularly preferred to use inorganic pigments since a surface feeling can be easily made similar to that of the printing paper which is an object of proof when the inorganic pigments are used.

In at least the uppermost layer of the ink-receptive layer of the present invention, a colored pigment having an average primary particle size or an average secondary primary particle size of preferably 1 μm or less, more preferably 0.1 to 1 μm is used as a coloring agent. When a colored dye is used as a coloring agent, light fading becomes remarkable and it becomes difficult to make a surface feeling similar to that of the printing paper which is an object of proof, so that a colored pigment is required to be used. Even when a water-resistant support having a centerline average roughness (Ra75) of 1.0 μm or less is used, if an average particle size of the colored pigment exceeds 1 μm, a surface feeling including color shade cannot be made similar to that of the printing paper which is an object of proof, so that such a colored pigment cannot be used. It is more preferred to use a colored pigment which satisfies a relation of r≧d where r is a center line average roughness Ra75 with a cut off value of 0.8 mm according to JIS-B0601 of the water-resistant support and d is an average particle size of the colored pigment to avoid bad influence of the colored pigment to the surface feeling.

As the colored pigment to be used in the present invention, there may be mentioned, for example, colored pigments such as titanium black, titanium yellow, ultramarine blue, Prussian blue, cobalt blue, carbon black, iron black, zinc oxide, cobalt oxide, silicon oxide, aluminum oxide, an azo pigment, a phthanocyanine pigment, a dye lake, starch, synthetic resin particles such as a urea-formalin resin and a melamine resin, silicone particles and the like, but the present invention is not limited by these. Also, as a colored pigment of the present invention, a white colored pigment may be used to make color shade similar to the printing paper which is an object of proof by improving whiteness. As such a white colored pigment, there may be mentioned those conventionally known in the art, for example, an inorganic pigment such as diatomaceous earth, clay, calcined clay, talc, kaolin, calcined kaolin, calcium carbonate, magnesium carbonate, titanium dioxide, titanium dioxide-coated mica, barium sulfate, molybdenum white, zinc white, lithopone, zinc sulfate, gypsum, white lead, calcium sulfate, zinc oxide, zinc hydroxide, zinc carbonate, hydrotalcite, aluminum silicate, calcium silicate, magnesium silicate, aluminum hydroxide, zeolite, magnesium hydroxide, titanium oxide, silica, glass powder, barium sulfate, etc., and organic pigments such as a polystyrene resin, polymethyl methacrylate resin, polycarbonate resin, polyacrylate copolymer resin, etc.

A solid content of the colored pigment to be added to the ink-receptive layer of the present invention is not specifically limited by the printing paper which is an object of proof so long as it can exhibit a desired color shade, and it is generally used in an amount of 0.001 to 1% by weight based on the total weight of the solid component in the ink-receptive layer to which the colored pigment is added.

In the present invention, a water-resistant support having a center line average roughness Ra75 with a cut off value of 0.8 mm according to JIS-B0601 of 1.0 μm or less is used, and a colorless or white matting agent having an average particle size of 1 to 10 μm and a colored pigment having an average particle size of 1 μm or less are contained in at least an uppermost ink-receptive layer, whereby color shade thereof can be made similar to that of a printing paper which is an object of proof. As a reason to use the colorless or white matting agent having an average particle size of 1 to 10 μm and the colored pigment having an average particle size of 1 μm or less in combination, it is difficult to prepare an ink-jet recording material which satisfies both of a surface feeling and color shade simultaneously when either one of them is used singly. When it is intended to make the ink-jet recording material similar to the printing paper which is an object of proof using a colored pigment alone without using a matting agent, even if color shape is matched, a surface feeling is not similar, whereas the surface feeling is matched, color shade is not matched. On the other hand, when it is intended to make the ink-jet recording material similar to the printing paper which is an object of proof by using the matting agent alone, it is difficult to make color shade similar to the printing paper so that both of them are required to be used in combination.

In an ink-jet recording material for proof having two or more ink-receptive layers which contain inorganic fine particles and a hydrophilic binder of the present invention, it is required to use a colorless or white matting agent having an average particle size of 1 to 10 µm and a colored pigment having an average particle size of 1 µm or less in at least the uppermost ink-receptive layer, and it is also possible to use the colorless or white matting agent having an average particle size of 1 to 10 µm and the colored pigment having an average particle size of 1 µm or less in an ink-receptive layer other than the uppermost ink-receptive layer. It is more preferred to add the colorless or white matting agent having an average particle size of 1 to 10 µm and the colored pigment having an average particle size of 1 µm or less to the uppermost ink-receptive layer alone, the matting agent is projected to the surface and the colored pigment is colored without receiving any effect from an upper layer.

In the ink-receptive layer of the present invention, a hydrophilic binder is used to maintain the characteristic as a film, and a water-soluble binder is preferably used since it has high transparency and is capable of obtaining higher permeability of ink. For the use of the hydrophilic binder, it is important that the hydrophilic binder does not clog voids of the layer by swelling at the initial stage of impregnating ink. In this point of view, a hydrophilic binder having a relatively low swellability at around the room temperature is preferably used. Preferred hydrophilic binders may include, for example, polyvinyl alcohol, polyethylene glycol, starch, dextrin, carboxy-methyl cellulose, or a derivative thereof, and more preferred hydrophilic binder is a completely or partially saponified polyvinyl alcohol or gelatin, particularly preferably a completely or partially saponified polyvinyl alcohol with a saponification degree of 80% or more and having an average polymerization degree of 200 to 5,000. Also, an amount of the hydrophilic binder is 40% by weight or less, preferably 35% by weight or less, particularly preferably 10 to 30% by weight based on an amount of the inorganic fine particles.

In the present invention, it is preferred to use a suitable cross-linking agent (or a hardening agent) in the ink-receptive layer in combination with the above-mentioned hydrophilic binder. Specific examples of the cross-linking agent may include an aldehyde type compound such as formaldehyde, glutaraldehyde, etc.; a ketone compound such as diacetyl, chloropentanedione, etc.; bis(2-chloroethylurea)-2-hydroxy-4,6-dichloro-1,3,5-triazine, a compound having a reactive halogen as disclosed in U.S. Pat. No. 3,288,775, divinylsulfone, a compound having a reactive olefin as disclosed in U.S. Pat. No. 3,635,718, a N-methylol compound as disclosed in U.S. Pat. No. 2,732,316, an isocyanate compound as disclosed in U.S. Pat. No. 3,103,437, an aziridine compound as disclosed in U.S. Pat. Nos. 3,017,280, 2,983,611, etc., a carbodiimide type compound as disclosed in U.S. Pat. No. 3,100,704, an epoxy compound as disclosed in U.S. Pat. No. 3,091,537, a halogen carboxyaldehyde compound such as mucochloric acid, a dioxane derivative such as dihydroxydioxane, an inorganic cross-linking agent such as chromium alum, zirconium sulfate, boric acid and a borate, and they may be used singly or in combination of two or more. Of these cross-linking agents, boric acid or a borate is particularly preferred.

In the present invention, a film surface pH of the ink-receptive layer containing inorganic fine particles and a hydrophilic binder is preferably 2.0 to 6.5. If the pH is less than 2.5, glossiness tends to be lost, while if it exceeds 6.5, non-printed portion tends to be deteriorated with a lapse of time. The surface pH of the ink-receptive layer is a surface pH obtained by dropping distilled water on the surface of the ink-receptive layer and measuring the pH of the distilled water after 30 seconds from the dropping according to the method of J.TAPPI paper pulp testing method No. 49.

The pH of the ink-receptive layer is preferably adjusted at a stage of a coating solution, but the pH of the coating solution and a film surface pH at a coated and dried state are not necessarily the same with each other. Thus, it is necessary to provisionally obtain a relation between the pH of the coating solution and the film surface pH by experiments and the like for the purpose of obtaining a predetermined film surface pH. A pH of the coating solution for an ink-receptive layer can be adjusted by using an acid and an alkali with a suitable combination. As an acid, there may be used, for example, an inorganic acid such as hydrochloric acid, nitric acid, sulfuric acid, phosphoric acid, etc., and an organic acid such as acetic acid, citric acid, succinic acid, etc. As an alkali, there may be used, for example, sodium hydroxide, aqueous ammonia, potassium carbonate, trisodium phosphate, or an alkali metal salt of a weak acid such as sodium acetate, etc., as a weak alkali.

In the ink-receptive layer of the present invention, it is further preferred to contain various kinds of oil droplets to improve brittleness of a film. As such oil droplets, there may be mentioned a hydrophobic high boiling point organic solvent (for example, liquid paraffin, dioctyl phthalate, tricresyl phosphate, silicone oil, etc.) or polymer particles (for example, particles in which at least one of a polymerizable monomer such as styrene, butyl acrylate, divinyl benzene, butyl methacrylate, hydroxyethyl methacrylate, etc. is polymerized) each having a solubility in water at room temperature of 0.01% by weight or less. Such oil droplets can be used in an amount in the range of 10 to 50% by weight based on the amount of the hydrophilic binder.

In the present invention, a surfactant may be added to the ink-receptive layer. The surfactant to be used may include either of an anionic, cationic, nonionic or betain type surfactant which may have a low molecular weight or a high molecular weight. At least one surfactant may be added to a coating solution for forming the ink-receptive layer. When two or more surfactants are used in combination, it is not preferred to use an anionic type together with a cationic type surfactant. An amount of the surfactant is preferably about 0.001 to about 5 g, more preferably about 0.01 to about 3 g per 100 g of the binder constituting the ink-receptive layer.

In the present invention, to the ink-receptive layer, various kinds of conventionally known additives such as a fixing agent of an ink dye, an UV absorber, an antioxidant, a dispersant of a pigment, an antifoaming agent, a leveling agent, an antiseptic agent, a fluorescent brightener, a viscosity stabilizer, a pH buffer, etc. may be added.

In the present invention, a coating method of the ink-receptive layer may be used any coating method conventionally known in the art. For example, there may be mentioned a slidelip system, a curtain system, an extrusion system, an air knife system, a roll coating system, a rod bar coating system, etc. In the present invention, a method which gives good surface feeling is a curtain system even when a coating solution for forming the ink-receptive layer with a higher solid concentration is used. By using the curtain system coating, an ink-receptive layer having a uniform surface irrespective of surface shape of a support can be obtained, and a drying efficiency of the ink-receptive layer is high and occurrence of a wave-like pattern made on the surface during a drying step is a little, whereby an ink-jet recording material having a uniform surface and excellent ink-absorption property can be obtained.

In the present invention, when the ink-receptive layer is formed by the curtain system coating, a viscosity of a coating composition for forming an ink-receptive layer is generally set within 40 to 2,500 mPa·s, preferably 100 to 2,000 mPa·s. If it is less than 40 mPa·s, disarray of a curtain film at the time of drawing tends to be caused, while if it exceeds 2,500 mPa·s, a dropping point of the curtain film moves to downstream, so that coating unevenness tends to be caused due to accompaniment of air. A solid concentration of the coating composition for forming an ink-receptive layer at the time of coating is adjusted to the above-mentioned viscosity range, and generally 14 to 40% by weight. By coating the coating solution with a high solid concentration, it is preferred in the points that a drying efficiency is improved and unevenness of the surface at the time of evaporating water, etc. can be prohibited.

In the present invention, in the ink-jet recording material, in addition to the ink-receptive layer containing inorganic fine particles and a hydrophilic binder, a protective layer containing a hydrophilic binder and/or inorganic fine particles, which does not substantially change feeling of the material.

EXAMPLES

In the following, the present invention is described in detail by referring to Examples, but the scope of the present invention is not limited by these. Also, all "parts" and "%" shown in Examples mean "parts by weight" and "% by weight", respectively, otherwise specifically mentioned.

Example 1

(Preparation of Polyolefin Resin-Coated Support)

A mixture of a bleached craft pulp of hardwood (LBKP) and a bleached sulfite pulp of softwood (NBSP) in amounts of 1:1 was subjected to beating until it becomes 300 ml with a Canadian Standard Freeness to prepare a pulp slurry. To the slurry were added 0.5% of an alkylketene dimer based on the pulp as a sizing agent, 1.0% of a polyacrylamide based on the pulp as a strengthening additive of paper, 2.0% of a cationic starch based on the pulp, and 0.5% of a polyamide epichlorohydrin resin based on the pulp, and the resulting slurry was diluted by water to make 1% of a slurry. Paper was prepared from the slurry by using a wire paper machine with a basis weight of 170 g/m² with drying and moisture adjustment to prepare a base paper for a polyolefin resin-coated paper. The base paper thus prepared was subjected to extrusion coating by a polyethylene resin composition in which 10% of an anatase type titanium oxide had been uniformly dispersed in 100% of a low density polyethylene with a density of 0.918 g/cm³ and melted at 320° C., with the conditions of 200 m/min so as to have a thickness of 30 μm, and then subjected to extrusion coating by using cooling rolls which had been subjected to fine surface-roughing treatment to provide a resin-coated paper layer on the surface. On the other surface of the base paper, a blended resin composition comprising 70 parts of a high-density polyethylene resin with a density of 0.962 g/cm³ and 30 parts of a low-density polyethylene resin with a density of 0.918 g/cm³ melted at 320° C. was subjected to extrusion coating with a thickness of 30 μm to provide a resin-coated layer at the back surface.

Onto the front surface of the above-mentioned polyolefin resin-coated paper was subjected to a high frequency corona discharge treatment, and then, a coating solution for forming a subbing layer having the composition as mentioned below was coated thereon to have a gelatin amount of 50 mg/m² and dried to prepare a water-resistant support A. A center line average roughness Ra75 at the surface of the resin-coated layer before providing the subbing layer was 0.8 μm.

| <Subbing layer> | |
|---|---|
| Lime-treated gelatin | 100 parts |
| Sulfosuccinic acid-2-ethyl hexyl ester salt | 2 parts |
| Chromium alum | 10 parts |

Also, in the same manner as in Example 1 except for changing the cooling rolls used at the time of providing a resin-coated layer at the surface of the water-resistant support A with those which are embossed to a coarse rough surface unevenness, a water-resistant support B was prepared. A center line average roughness Ra75 at the surface of the resin-coated layer before providing the subbing layer was 1.5 μm.

Also, a mixture of a bleached craft pulp of hardwood (LBKP) and a bleached sulfite pulp of softwood (NBSP) in amounts of 1:1 was subjected to beating until it becomes 300 ml with a Canadian Standard Freeness to prepare a pulp slurry. To the slurry were added 0.5% of an alkylketene dimer based on the pulp as a sizing agent, 1.0% of a polyacrylamide based on the pulp as a strengthening additive of paper, 2.0% of a cationic starch based on the pulp, and 0.5% of a polyamide epichlorohydrin resin based on the pulp, and the resulting slurry was diluted by water to make 1% of a slurry. Paper was prepared from the slurry by using a wire paper machine with a basis weight of 170 g/m² with drying and moisture adjustment to prepare a paper support C.

On the surface of the above-mentioned water-resistant support A was coated a coating solution comprising the following formulation as a ink-receptive layer with a slide coating device so as to be a solid content of the coating amount of 22 g/m² and dried to provide an ink-receptive layer to prepare an ink-jet recording material of Example 1.

| <Formulation of ink-receptive layer> | |
|---|---|
| Fumed silica | 100 parts |
| (Average particle size: 7 nm, Specific surface area by BET method: 300 m²/g) | |
| Dimethyldially ammonium chloride homopolymer | 4 parts |
| (Sharol DC902P, trade name, available from Daiichi Kogyo Seiyaku K.K., Molecular weight: 9,000) | |
| Boric acid | 3 parts |
| Polyvinyl alcohol | 20 parts |
| (Saponification degree: 88%, Average polymerization degree: 3,500) | |
| Surfactant | 0.3 part |
| Colored pigment A | 0.01 part |
| (TB500, average particle size: 0.3 μm, available from Dainichiseika Color & Chemicals Mfg. Co., Ltd.) | |
| Colored pigment B | 0.016 part |
| (TB910, average particle size: 0.3 μm, available from Dainichiseika Color & Chemicals Mfg. Co., Ltd.) | |

-continued

| <Formulation of ink-receptive layer> | |
|---|---|
| Matting agent<br>(Wet silica P78A, average particle size:<br>3 μm, available from Mizusawa Industrial<br>Chemicals, Ltd.) | 1 part |

Comparative Example 1

In the same manner as in Example 1 except for using the water-resistant support B in place of the water-resistant support A in the preparation of the ink-jet recording material of Example 1, an ink-jet recording material of Comparative example 1 was prepared.

Comparative Example 2

In the same manner as in Example 1 except for using the paper support C in place of the water-resistant support A in the preparation of the ink-jet recording material of Example 1, an ink-jet recording material of Comparative example 2 was prepared.

Example 2

In the same manner as in Example 1 except for changing amounts of the colored pigment in the ink-receptive layer to 0.01 part of the colored pigment A and 0.01 part of colored pigment B in the preparation of the ink-jet recording material of Example 1, an ink-jet recording material of Example 2 was prepared.

Example 3

In the same manner as in Example 1 except for replacing the fumed silica and Dimethyldiallyl ammonium chloride homopolymer in the ink-receptive layer with wet type pulverized silica dispersion (average particle size: 200 nm) in the preparation of the ink-jet recording material of Example 1, an ink-jet recording material of Example 3 was prepared. The wet type pulverized silica dispersion was prepared as mentioned below.

To water were added a Dimethyldiallyl ammonium chloride homopolymer (molecular weight: 9,000, 4 parts) and precipitated method silica (Nipsil VN3, average secondary particle size: 23 μm, 100 parts), and the resulting mixture was dispersed by using a saw blade type dispersing machine (blade circumferential speed: 30 m/sec) to obtain a provisional dispersion. Next, the resulting provisional dispersion was passed once through a beads mill under the conditions of a filling ratio of zirconia beads having a diameter of 0.3 mm being 80% by volume and a disc circumferential speed of 10 m/sec to obtain a wet type pulverized silica dispersion having a solid concentration of 30% by weight and an average secondary particle size of 200 nm.

Example 4

In the same manner as in Example 1 except for using alumina hydrate (average particle size: 15 nm) in place of the fumed silica in the ink-receptive layer in the preparation of the ink-jet recording material of Example 1, an ink-jet recording material of Example 4 was prepared.

Example 5

In the same manner as in Example 1 except for using 80 parts of gelatin (IK-2000, trade name, available from Nitta Gelatin Inc.) in place of polyvinyl alcohol in the ink-receptive layer in the preparation of the ink-jet recording material of Example 1, an ink-jet recording material of Example 5 was prepared.

Example 6

In the same manner as in Example 1 except for changing amounts of the colored pigment in the ink-receptive layer to 0.01 part of the colored pigment A and 0.02 part of colored pigment B in the preparation of the ink-jet recording material of Example 1, an ink-jet recording material of Example 6 was prepared.

Example 7

In the same manner as in Example 1 except for using a polystyrene resin (average particle size: 4 μm) as a matting agent in the ink-receptive layer in the preparation of the ink-jet recording material of Example 1, an ink-jet recording material of Example 7 was prepared.

Example 8

In the same manner as in Example 1 except for using wet method silica P527 (available from Mizusawa Industrial Chemicals, Ltd., average particle size: 1.5 μm) as a matting agent in the ink-receptive layer in the preparation of the ink-jet recording material of Example 1, an ink-jet recording material of Example 8 was prepared.

Example 9

In the same manner as in Example 1 except for using wet method silica P766 (available from Mizusawa Industrial Chemicals, Ltd., average particle size: 6.5 μm) as a matting agent in the ink-receptive layer in the preparation of the ink-jet recording material of Example 1, an ink-jet recording material of Example 9 was prepared.

Example 10

In the same manner as in Example 1 except for using Pig. Orange-13 which had been dispersed so that an average particle size became 0.9 μm in place of the colored pigment A in the ink-receptive layer and using Pig. Yellow-83 which had been dispersed so that an average particle size became 0.9 μm in place of the colored pigment B in the ink-receptive layer in the preparation of the ink-jet recording material of Example 1, an ink-jet recording material of Example 10 was prepared.

Comparative Example 3

In the same manner as in Example 1 except for using wet method silica P526U (available from Mizusawa Industrial Chemicals, Ltd., average particle size: 0.6 μm) as a matting agent in the ink-receptive layer in the preparation of the ink-jet recording material of Example 1, an ink-jet recording material of Comparative example 3 was prepared.

Comparative Example 4

In the same manner as in Example 1 except for using wet method silica NipGel BY-001 (available from Nippon Silica Industrial Co., Ltd., average particle size: 14 μm) as a matting agent in the ink-receptive layer in the preparation of the ink-jet recording material of Example 1, an ink-jet recording material of Comparative example 4 was prepared.

Comparative Example 5

In the same manner as in Example 1 except for using Pig. Orange-13 which had been dispersed so that an average particle size became 1.5 μm in place of the colored pigment A in the ink-receptive layer and using Pig. Yellow-83 which had been dispersed so that an average particle size became 1.5 μm in place of the colored pigment B in the ink-receptive layer in the preparation of the ink-jet recording material of Example 1, an ink-jet recording material of Comparative example 5 was prepared.

Comparative Example 6

In the same manner as in Example 1 except for using a dye colorant (Aizen Primula Orange FPH, available from Hodogaya Chemical Co., Ltd.) in place of the colored pigment A in the ink-receptive layer and using a dye colorant (EM Yellow 2MN-2, available from Toyo Ink Mfg. Co., Ltd.) in place of the colored pigment B in the ink-receptive layer in the preparation of the ink-jet recording material of Example 1, an ink-jet recording material of Comparative example 5 was prepared.

Examples 11 to 20 and Comparative Examples 7 to 12

In the ink-jet recording materials obtained in Examples 1 to 10 and Comparative examples 1 to 6, an amount of the matting agent in the ink-receptive layer was changed from 1 part to 4 parts, ink-jet recording materials of Examples 11 to 20 and Comparative examples 7 to 12 were obtained.

With regard to the ink-jet recording materials obtained in Examples 1 to 10 and Comparative examples 1 to 6, art paper available from Mitsubishi Paper Mills, Ltd. (Tokubishi art both surfaces N (basis weight: 127 g/m$^2$), trade name) was used as a printing paper A which is an object of proof, and with regard to Examples 11 to 20 and Comparative examples 7 to 12, coated paper available from Mitsubishi Paper Mills, Ltd. (Pearl coat (basis weight: 127 g/m$^2$), trade name) was used as a printing paper B which is an object of proof.

Evaluations of the ink-jet recording materials obtained in Examples 1 to 10 and Comparative examples 1 to 6 and the printing paper which is an object of proof were carried out by the methods as mentioned below and the results are shown in Table 1.

<Lightness, Chromaticity and Absolute Values of Components of Color Difference>

Values of lightness index (L*) and perception chromaticity indexes (a*, b*) of the resulting ink-jet recording materials were measured by using a color and color difference meter (Gretag Spectrolino, trade name). Components of color differences of the respective ink-jet recording materials were measured according to a measurement method of color and a light source for measurement regulated by JIS-Z8722 and JIS-Z8720, and absolute values of components (ΔL*, Δa*, Δb*) of color differences regulated by JIS-Z8730 were calculated from values of lightness index (L*) and perception chromaticity indexes (a*, b*) regulated by JIS-Z8729 of an ink-jet recording material for proof, and values of lightness index (L*) and perception chromaticity indexes (a*, b*) of a printing paper which is an object of proof. Moreover, the measurement is specifically carried out under the conditions of D-n P (see Paragraph 6.3.2 in JIS-Z8722) with standard light of D65 as a light source.

<Light Fading Property Evaluation>

Light fading of the ink-jet recording materials was evaluated by treating the ink-jet recording materials with a Xenon Whetherometer (Atlus Ci4000, 0.2 W/m2 (340 nm)) for 120 hours and evaluated a degree of fading by light. Those in which substantially no change in colors before and after the treatment are evaluated to as ○, those slightly changed are Δ, and those in which change in color can be clearly admitted are as X.

<Looks Evaluation>

Onto the resulting ink-jet recording materials, solid images of black, cyan, magenta and yellow, and a standard image N3 (a fruit basket) described in JIS-X9201 were printed by using an ink-jet printer (MC7000C, trade name, manufactured by Seiko Epson Corporation), and color feeling as a printed material was totally evaluated. Incidentally, in the evaluation, the printed materials were evaluated by comparing with those in which the same printing was carried out onto a printing paper which is an object by offset printing. Those in which difference in feeling is a little are evaluated to as ○, those in which difference in feeling can be slightly admitted are evaluated to as Δ, and those in which difference in feeling can be strongly admitted are evaluated to as X.

<Surface Feeling Evaluation>

Surface feeling of the respective recording materials is compared to a printing paper and evaluated with feeling. Those in which difference in feeling from the printing paper which is an object of proof is a little are evaluated to as ○, those in which difference in feeling can be slightly admitted are evaluated to as Δ, and those in which difference in feeling can be strongly admitted are evaluated to as X.

<Cockling Evaluation>

Evaluation of cockling was carried out by using an ink-jet printer (PM950C, trade name, manufactured by Seiko Epson Corporation) and multiple color solid printing with a blue printing was carried out, and a state of paper wrinkle was evaluated with eyes. Those in which substantially no occurrence in paper wrinkle are evaluated to as ○, those in which paper wrinkle slightly occurred are Δ, and those in which paper wrinkle significantly occurred are as X.

TABLE 1

| | Components of color difference against printing paper | | | Light fading | Looks | Surface feeling | Cockling |
|---|---|---|---|---|---|---|---|
| | ΔL* | Δa* | Δb* | | | | |
| Example 1 | 0.65 | 0.34 | 0.37 | ○ | ○ | ○ | ○ |
| 2 | 1.22 | 0.77 | 1.05 | ○ | ○~Δ | ○ | ○ |
| 3 | 0.90 | 0.50 | 0.35 | ○ | ○ | ○ | ○ |
| 4 | 1.15 | 0.61 | 1.05 | ○ | ○~Δ | Δ | ○ |

TABLE 1-continued

| | Components of color difference against printing paper | | | Light fading | Surface Looks | face feel-ing | Cockl-ing |
|---|---|---|---|---|---|---|---|
| | ΔL* | Δa* | Δb* | | | | |
| 5 | 1.21 | 1.29 | 1.09 | ○ | ○~Δ | Δ | ○ |
| 6 | 1.73 | 0.78 | 2.65 | ○ | Δ | ○ | ○ |
| 7 | 0.88 | 0.50 | 0.77 | ○ | Δ | Δ | ○ |
| 8 | 0.82 | 0.78 | 0.63 | ○ | ○ | Δ | ○ |
| 9 | 0.76 | 0.79 | 0.60 | ○ | ○ | Δ | ○ |
| 10 | 1.05 | 0.45 | 0.70 | ○ | Δ | Δ | ○ |
| Comparative example 1 | 0.89 | 0.70 | 0.63 | ○ | X | X | ○ |
| 2 | 1.61 | 0.91 | 1.15 | ○ | X | X | X |
| 3 | 1.26 | 0.75 | 0.55 | ○ | Δ~X | X | ○ |
| 4 | 1.15 | 0.60 | 0.68 | ○ | Δ | X | ○ |
| 5 | 1.40 | 0.53 | 1.06 | ○ | Δ | X | ○ |
| 6 | 0.77 | 0.49 | 0.90 | X | ○ | Δ | ○ |
| A | — | — | — | ○ | — | — | ○ |
| Example 11 | 0.84 | 0.00 | 0.55 | ○ | ○ | ○ | ○ |
| 12 | 1.33 | 0.55 | 0.90 | ○ | ○~Δ | ○ | ○ |
| 13 | 1.21 | 0.35 | 0.54 | ○ | ○ | ○ | ○ |
| 14 | 0.90 | 0.68 | 0.80 | ○ | ○~Δ | Δ | ○ |
| 15 | 1.25 | 1.10 | 1.19 | ○ | ○~Δ | Δ | ○ |
| 16 | 1.81 | 1.41 | 2.75 | ○ | Δ | ○ | ○ |
| 17 | 0.91 | 0.56 | 0.77 | ○ | Δ | Δ | ○ |
| 18 | 0.89 | 0.83 | 0.70 | ○ | ○ | Δ | ○ |
| 19 | 0.85 | 0.83 | 0.68 | ○ | ○ | Δ | ○ |
| 20 | 1.20 | 0.60 | 0.80 | ○ | Δ | Δ | ○ |
| Comparative example 7 | 0.89 | 0.77 | 1.55 | ○ | X | X | ○ |
| 8 | 1.70 | 1.04 | 1.30 | ○ | X | X | X |
| 9 | 1.10 | 0.86 | 0.75 | ○ | Δ~X | X | ○ |
| 10 | 1.21 | 0.90 | 0.80 | ○ | X | X | ○ |
| 11 | 1.61 | 0.55 | 1.21 | ○ | Δ | X | ○ |
| 12 | 0.90 | 0.70 | 0.80 | X | ○ | Δ | ○ |
| B | — | — | — | ○ | — | — | ○ |

From the results shown in Table 1, when the ink-jet recording materials of Examples 1 to 20 in which a center line average roughness (Ra75) with a cut off value of 0.8 mm described in JIS-B0601 of a water-resistant support is 1.0 μm or less, and the uppermost ink-receptive layer contains a matting agent having an average particle size of 1 to 10 μm and a colored pigment having an average particle size of 1 μm or less are used as a printing for proof, in spite of the difference in the compositions at the surface of the materials, extremely close surface feeling to a printed material after actual printing can be realized. Thus, it can be understood that the ink-jet recording materials of the present invention are materials suitable for proof. On the contrary, in the ink-jet recording materials of Comparative examples 1 to 12, surface feeling close to the printing paper cannot be obtained, and looks are quite different from the same. Thus, it can be understood that they are not suitable for the use of proof.

Example 21

On the surface of the above-mentioned water-resistant support A, two kinds of coating solutions for forming ink-receptive layers D1 and D2 having the formulations mentioned below were coated simultaneously in this order with coated amounts (solid components) of 16 g/m² for D1 and 8 g/m² for D2 by a slide bead coating device, and dried to provide ink-receptive layers whereby an ink-jet recording material of Example 21 was prepared.

<Formulation of ink-receptive layer D1>

| | |
|---|---|
| Gas phase method silica (Average particle size: 7 nm, Specific surface area by BET method: 300 m²/g) | 100 parts |
| Dimethyldially ammonium chloride homopolymer (Sharol DC902P, trade name, available from Daiichi Kogyo Seiyaku K.K., Molecular weight: 9,000) | 4 parts |
| Boric acid | 3 parts |
| Polyvinyl alcohol (Saponification degree: 88%, Average polymerization degree: 3,500) | 20 parts |
| Surfactant | 0.3 part |

<Formulation of ink-receptive layer D2>

| | |
|---|---|
| Alumina hydrate (Average particle size: 15 nm) | 100 parts |
| Polyvinyl alcohol (Saponification degree: 88%, Average polymerization degree: 3,500) | 10 parts |
| Boric acid | 1 parts |
| Surfactant | 0.3 part |
| Colored pigment A (TB500, average particle size: 0.3 μm, available from Dainichiseika Color & Chemicals Mfg. Co., Ltd.) | 0.01 part |
| Colored pigment B (TB910, average particle size: 0.3 μm, available from Dainichiseika Color & Chemicals Mfg. Co., Ltd.) | 0.016 part |
| Matting agent (Wet silica P78A, average particle size: 3 μm, available from Mizusawa Industrial Chemicals, Ltd.) | 1 part |

Comparative Example 13

In the same manner as in Example 21 except for adding 0.005 part of the colored pigment A, 0.008 part of colored pigment B and 0.5 part of the matting agent to the ink-receptive layer D1 in the preparation of the ink-jet recording material of Example 21, an ink-jet recording material of Comparative example 13 was prepared.

Example 22

In the same manner as in Example 21 except for changing amounts of the colored pigment A, the colored pigment B and the matting agent in the ink-receptive layer to 0.0025 part of the colored pigment A, 0.004 part of colored pigment B and 0.25 part of the matting agent to D1, and 0.005 part of the colored pigment A, 0.008 part of colored pigment B and 0.5 part of the matting agent to D2 in the preparation of the ink-jet recording material of Example 21, an ink-jet recording material of Example 22 was prepared.

Examples 23 and 24 and Comparative Example 14

In the ink-jet recording materials obtained in Examples 21 and 22 and Comparative example 13, an amount of the matting agent in the ink-receptive layer was changed from 1 part to 4 parts, ink-jet recording materials of Examples 23 and 24 and Comparative example 14 were obtained.

With regard to the ink-jet recording materials obtained in Examples 21 and 22 and Comparative example 13, art paper available from Mitsubishi Paper Mills, Ltd. (Tokubishi art both surfaces N (basis weight: 127 g/m²), trade name) was used as a printing paper A which is an object of proof, and with regard to Examples 23 and 24 and Comparative example 14, coated paper available from Mitsubishi Paper Mills, Ltd. (Pearl coat (basis weight: 127 g/m²), trade name) was used as a printing paper B which is an object of proof.

Evaluation of the ink-jet recording materials prepared in Examples 21 to 24 and Comparative examples 13 and 14 and a printing paper which is an object of proof was carried out by the methods as mentioned above. The results are shown in Table 2.

TABLE 2

| | Components of color difference against printing paper | | | Light fading | Looks | Surface feeling | Cockling |
|---|---|---|---|---|---|---|---|
| | ΔL* | Δa* | Δb* | | | | |
| Example 21 | 0.86 | 0.65 | 0.56 | ○ | ○ | ○ | ○ |
| 22 | 1.05 | 0.78 | 0.81 | ○ | Δ | Δ | ○ |
| Comparative example 13 | 1.35 | 0.89 | 1.25 | ○ | X | X | ○ |
| A | — | — | — | ○ | — | — | ○ |
| Example 23 | 0.95 | 0.31 | 0.78 | ○ | ○ | ○ | ○ |
| 24 | 1.00 | 0.68 | 1.12 | ○ | Δ | Δ | ○ |
| Comparative example 14 | 1.56 | 0.90 | 1.78 | ○ | X | X | ○ |
| B | — | — | — | ○ | — | — | ○ |

From the results shown in Table 2, when the ink-jet recording materials of Examples 21 to 24 in which a center line average roughness (Ra75) with a cut off value of 0.8 mm described in JIS-B0601 of a water-resistant support is 1.0 μm or less, and the uppermost ink-receptive layer contains a matting agent having an average particle size of 1 to 10 μm and a colored pigment having an average particle size of 1 μm or less are used as a printing for proof, in spite of the difference in the compositions at the surface of the materials, extremely close surface feeling to a printed material after actual printing can be realized. Thus, it can be understood that the ink-jet recording materials of the present invention are materials suitable for proof. On the contrary, in the ink-jet recording materials of Comparative examples 13 and 14, surface feeling close to the printing paper cannot be obtained, and looks are quite different from the same. Thus, it can be understood that they are not suitable for the use of proof.

As explained in detail above, by carrying out the present invention, an ink-jet recording material for proof which is suitable for printing proof and has suitability in ink-jet printing can be provided.

The invention claimed is:

1. A method of using an ink-jet recording material for printing proof, wherein the ink-jet recording material comprises a water-resistant support and at least one ink-receptive layer containing inorganic fine particles and a hydrophilic binder provided on the support, the water-resistant support has a center line average roughness Ra75 with a cut off value of 0.8 mm according to JIS-B0601 of 1.0 μm or less, an uppermost ink-receptive layer farthest from the water-resistant support contains a colorless or white matting agent having an average particle size of 1 to 10 μm and a colored pigment having an average particle size of 1 μm or less, and the inorganic fine particles are at least one selected from the group consisting of synthetic silica, alumina and alumina hydrate each having an average particle size of 1 μm or less.

2. The method according to claim 1, wherein the synthetic silica is fumed silica having an average primary particle size of 50 nm or less.

3. The method according to claim 1, wherein the synthetic silica is wet type pulverized silica in which wet type method silica is pulverized to an average particle size of 500 nm or less by using a media mill in an aqueous medium in the presence of a cationic compound.

4. The method according to claim 1, wherein the material satisfies the relationship of the formula:

$$r \geq d$$

wherein r represents a center line average roughness Ra75 with a cut off value of 0.8 mm according to JIS-B0601 of the water-resistant support and d represents an average particle size of the colored pigment.

5. The method according to claim 1, wherein the hydrophilic binder is polyvinyl alcohol or gelatin.

6. The method according to claim 1, wherein the matting agent is an inorganic pigment.

7. The method according to claim 1, wherein the water-resistant support is a resin-coated paper.

8. The method according to claim 1, wherein difference in absolute values of components of color differences ΔL*, Δa* and Δb* of lightness index L* and perception chromaticity indexes a* and b* regulated by JIS-Z8730 of the ink-jet recording material for proof and a printing paper which is an object of proof are each 1.5 or less.

9. The method according to claim 1, wherein the inorganic fine particles are contained in an amount of 50% by weight or more based on the total solid component of the ink-receptive layer.

10. The method according to claim 1, wherein the inorganic fine particles are alumina hydrate having an average primary particle size of 5 to 50 nm.

11. The method according to claim 1, wherein inorganic fine particles are wet method silica having a secondary average particle size of 500 nm or less or alumina having a secondary average particle size of 50 to 300 nm.

12. The method according to claim 1, wherein the ink-receptive layer contains the inorganic fine particles in an amount of 8 g/m² or more in total as a solid content.

13. The method according to claim 1, wherein the colorless or white matting agent having an average particle size of 1 to 10 μm is contained in an amount of 0.1 to 10% by weight based on the total solid weight of the ink-receptive layer to be added.

14. The method according to claim 1, wherein the colored pigment having an average particle size of 1 μm or less is contained in an amount of 0.001 to 1% by weight based on the total solid component in the ink-receptive layer to which the colored pigment is added.

* * * * *